United States Patent [19]

Gottbreht et al.

[11] 4,293,987

[45] Oct. 13, 1981

[54] METHOD OF FABRICATING CAPACITIVE TOUCH SWITCH PANEL

[75] Inventors: Tom L. Gottbreht, Plano; Glen C. Shepherd, Garland, both of Tex.

[73] Assignee: Texas Instruments Incorporated, Dallas, Tex.

[21] Appl. No.: 106,294

[22] Filed: Dec. 21, 1979

Related U.S. Application Data

[60] Division of Ser. No. 105,802, Dec. 20, 1979, which is a continuation of Ser. No. 887,387, Mar. 16, 1978.

[51] Int. Cl.$^3$ .......................... H01G 4/30; H01H 9/26
[52] U.S. Cl. .................................... 29/25.42; 29/830; 200/DIG. 1; 219/10.5 T; 219/10.5 R; 361/280
[58] Field of Search ............................. 29/25.42, 830; 219/10.55 R, 10.55 B, 10.55 C, 10.55 M, 506; 200/52 R, DIG. 1, 5 A, 268, 269, 292; 361/280, 306, 313

[56] References Cited

U.S. PATENT DOCUMENTS

| | | | |
|---|---|---|---|
| 3,971,013 | 7/1976 | Challoner et al. | 340/337 |
| 4,056,699 | 11/1977 | Jordan | 200/5 A |
| 4,149,217 | 4/1979 | Tucker | 200/DIG. 1 |

FOREIGN PATENT DOCUMENTS 54-127654  5/1979  Japan ................................ 200/5 A

*Primary Examiner*—Carl E. Hall

*Attorney, Agent, or Firm*—John A. Haug; James P. McAndrews; Melvin Sharp

[57] ABSTRACT

An improved technique for the manufacture of capacitive touch switch panel assemblies, utilized to control appliances and the like, provides simplified construction and manufacture. The technique involves the formation of conductive touch pads on one major surface of a dielectric panel and the formation of pairs of spaced-apart conductive pads and conductive lead members to the conductive pads on a separate flexible synthetic resin sheet. The synthetic resin is bonded to the opposite major surface of the dielectric panel with each pair of conductive pads on the synthetic resin sheet in registry with a corresponding touch pad on the one major surface of the dielectric panel. The synthetic resin sheet includes a portion having a conductive lead pattern formed thereon which is not bonded to the dielectric panel; this portion serves as a flexible connector for connection of the touch panel to a circuit board or the like. In one embodiment, the conductive lead pattern includes an interconnection pattern for circuit elements such as integrated circuits or display elements mounted on the synthetic resin sheet or the dielectric panel. The conductive lead pattern on the synthetic resin sheet may be a single-layer or a multi-layer pattern and the conductor may be formed from a single material or different materials having predetermined resistive characteristics whereby external resistors to the capacitive touch switches and/or circuit elements may be eliminated from the circuit.

32 Claims, 11 Drawing Figures

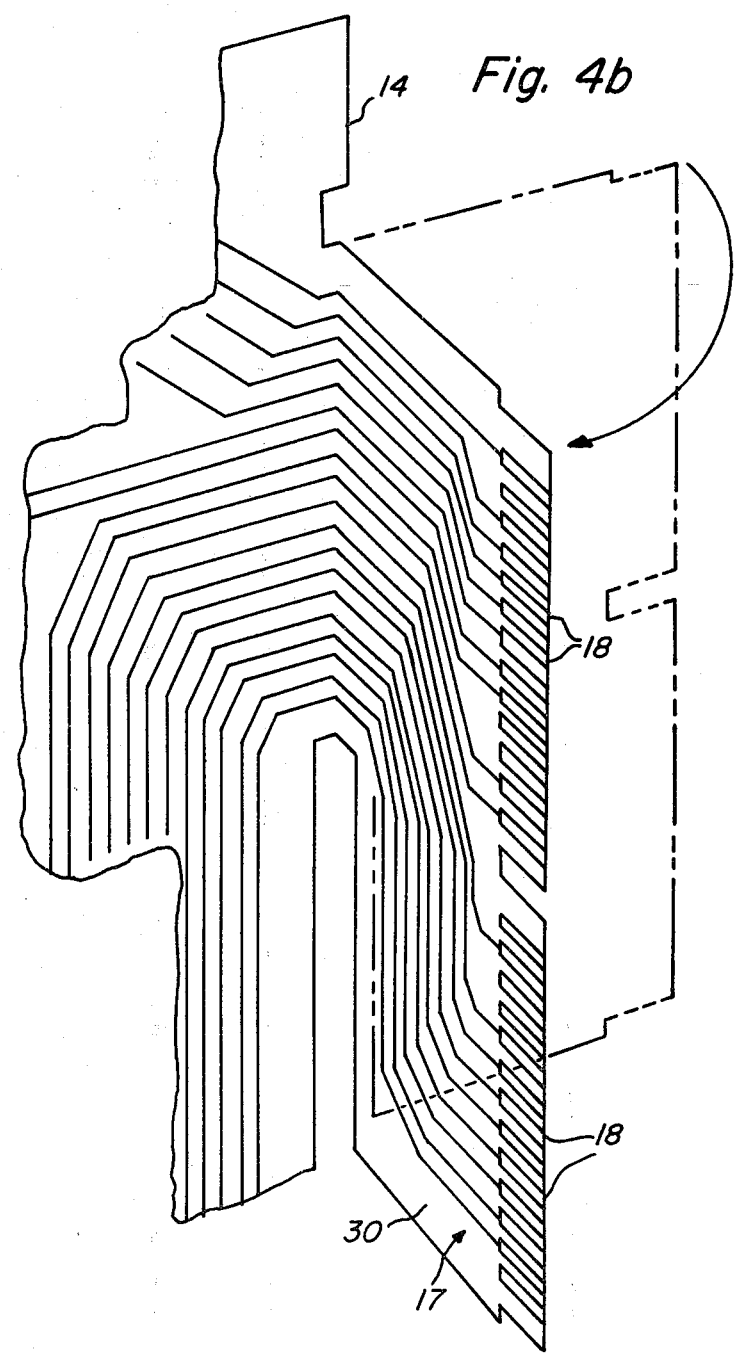

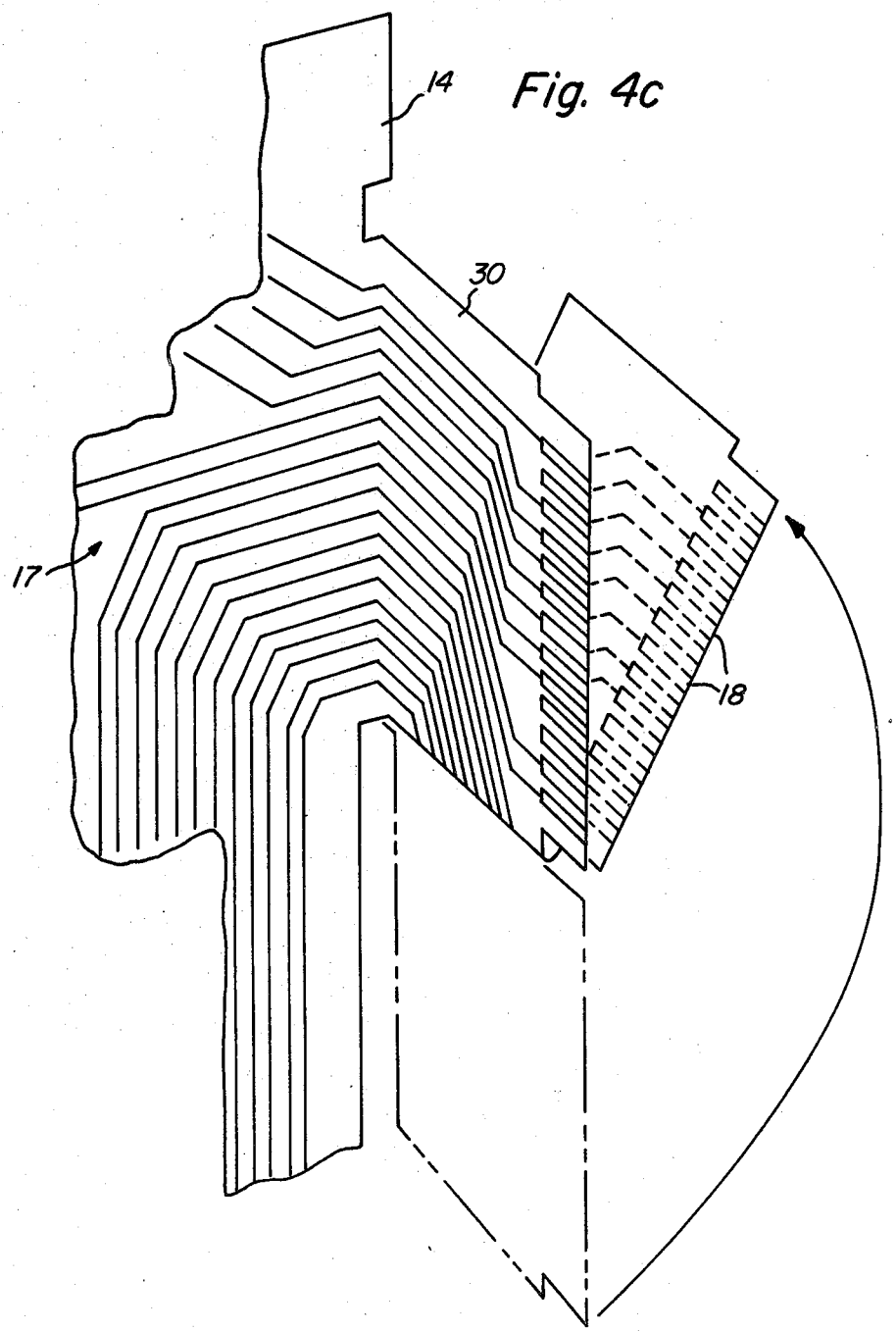

4,293,987

METHOD OF FABRICATING CAPACITIVE TOUCH SWITCH PANEL

This is a division of application Ser. No. 105,802, filed Dec. 20, 1979 which in turn is a continuation of application Ser. No. 887,387, filed Mar. 16, 1978.

BACKGROUND OF THE INVENTION

This invention relates to capacitive touch panel assemblies for controlling appliances and the like, and more particularly, to capacitive touch panels having conductive pads and leads formed on flexible synthetic resin sheets and to the method of making the same.

Capacitive touch panels have become widely used in consumer appliances such as microwave ovens, electric ranges and the like because of their ease of use and cleanability. Presently, touch panel assemblies are manufactured by forming a conductive touch pad on one surface of a glass panel and forming a pair of spaced-apart conductors on the opposite surface of the glass panel in registry with the touch pads on the one surface. Electrical contact to the spaced-apart conductors on the opposite surface of the glass panel requires the use of a complex arrangement of spring contact members affixed to a circuit board or the like. The circuit board is mounted so that it is held in registry with the glass panel and the spring contact members make electrical contact with corresponding ones of the conductors on the opposite surface of the glass panel. This arrangement is complex, relatively expensive to manufacture and generally requires the assembly to be thick enough to accommodate the glass panel, spring contact members and circuit board on which the spring contact members are mounted. Furthermore, for shatterproof protection, a synthetic resin film has been bonded to the back surface of the glass panel; holes are required to be formed in the synthetic resin film so that the spring contacts of the printed circuit board can make electrical contact with the conductors formed on the back surface of the panel.

It is therefore an object of the present invention to provide an improved capacitive touch switch panel assembly for appliances and the like.

Another object of the invention is to provide a capacitive touch switch panel having an improved means for providing electrical contact with the capacitive touch switch conductive pads.

A further object of the invention is to provide a capacitive touch switch panel assembly which is simpler, requires less parts and is therefore less expensive to manufacture.

Yet another object of the invention is to provide an improved method of manufacturing capacitive touch switch panels and assemblies.

It is another object of the invention to provide an improved capacitive touch-operated electronic controller for appliances and the like and an improved method for making the same.

It is a further object of the invention to reduce the number of external resistors required in electronic controllers with capacitive touch switch panels.

It is still another object of the invention to provide a capacitive touch switch panel with improved means for connection to a circuit board mounted at any desired angle with respect to the panel.

It is yet another object of the invention to provide a relatively thin capacitive touch switch panel assembly.

Yet a further object of the invention is to provide an electronic controller with capacitive touch switch panel having the switch conductors and electronic circuitry mounted on a single sheet of flexible film.

BRIEF DESCRIPTION OF THE INVENTION

These and other objects are accomplished in accordance with the present invention in which an improved capacitive touch panel and assembly is manufactured by forming conductive touch pads on one major surface of a dielectric panel and forming pairs of spaced-apart conductive pads and conductive lead members, including lead members connected to the conductive pads, on a separate sheet of flexible synthetic resin film. The synthetic resin sheet is then bonded to the opposite major surface of the dielectric panel with each pair of conductive pads on the synthetic resin sheet in registry with a corresponding touch pad on the one major surface of the dielectric panel. The flexible synthetic resin sheet includes at least a portion having a conductive lead pattern formed thereon which is not bonded to the dielectric panel; this flexible extension portion, which can be made to any desired length, serves as a flexible connector member for connection of the touch panel to a circuit board or the like. Furthermore, the circuit board may be mounted at any desired angle with respect to the dielectric panel to provide flexibility of design. The conductive lead members on the flexible extension portion may include terminal pads to be plugged directly into a flexible film connector socket located on the printed circuit board.

In one embodiment, tin oxide touch pads are formed on one major surface of a glass panel by vapor deposition techniques. Pairs of spaced-apart silver pads and silver lead members to the conductive pads are formed on a relatively thin flexible sheet of polyester material by silk screening of a silver epoxy material. The polyester sheet is then adhesively bonded to the opposite major surface of the glass panel with each pair of silver pads on the polyester sheet in registry with a corresponding tin oxide pad on the one major surface of the glass panel.

In a further embodiment, the conductive lead pattern includes an interconnection pattern for circuit elements such as semiconductor integrated circuit chips or display elements which are mounted either directly on the synthetic resin sheet or directly on the opposite major surface of the dielectric panel. The conductive lead pattern on the synthetic resin sheet may be a single layer formed on one major surface of the sheet, multilayers provided by the formation of conductive patterns of both major surfaces of the sheet, or multi-layers formed by providing multiple patterned sheets or by folding a single sheet having a conductive pattern formed on one major surface of the sheet. Further additional layers of interconnects may be provided by stacking several sheets of the synthetic resin material or by multiple folding of one or more sheets.

In yet another embodiment, the conductive lead pattern on the synthetic sheet includes at least some leads formed of a relatively high resistive material such as resistive carbon paint whereby external resistors to the capacitive touch switches or other circuit elements may be eliminated from the circuit.

BRIEF DESCRIPTION OF THE DRAWINGS

Still further objects and advantages of the invention will become apparent from the detailed description and claims when read in conjunction with the accompanying drawings in which:

FIGS. 4a–4c are views in perspective illustrating the manner in which the patterned flexible synthetic resin sheet of FIG. 3 may be folded to provide a multi-layer conductive pattern.

DETAILED DESCRIPTION OF PREFERRED EMBODIMENTS OF THE INVENTION

Figure 2:
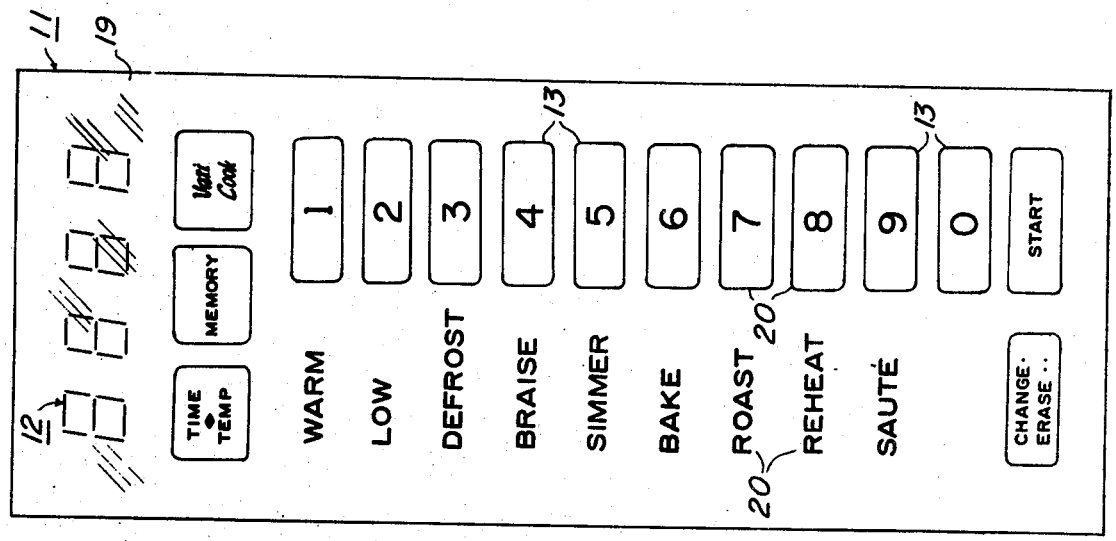
FIG. 2 is a front plan view of the capacitive touch switch panel of the appliance illustrated in FIG. 1.
Figure 1:
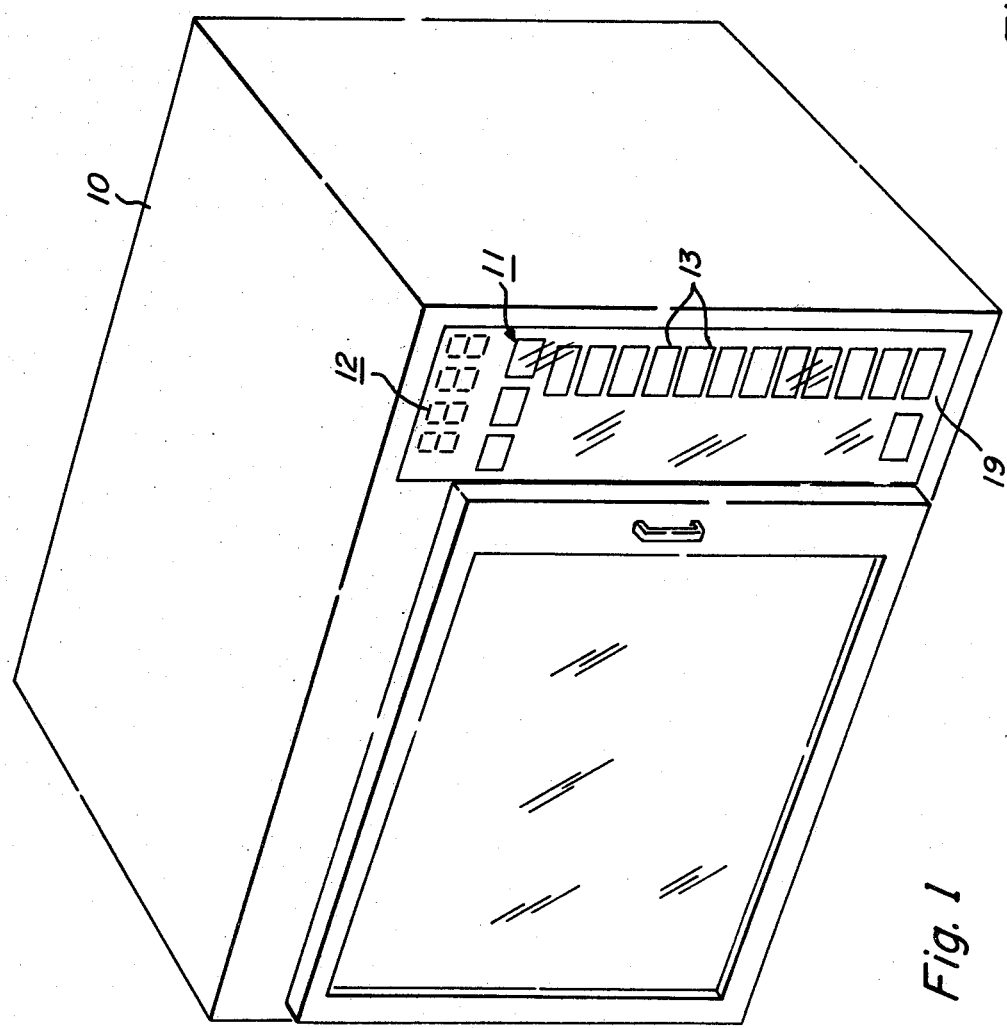
FIG. 1 is a front perspective view of an appliance incorporating a capacitive touch switch panel and assembly in accordance with the present invention.

Referring then to the drawings, and particularly, to FIGS. 1 and 2, an appliance such as microwave oven 10 includes an easily operated, easily cleanable capacitive touch switch panel assembly 11 in accordance with the present invention for controlling the time and temperature cycles of microwave oven 10. Assembly 11 includes a rigid dielectric front panel 19 which may be comprised of glass such as soda lime glass, plastic, such as Plexiglas material, or other suitable rigid dielectric material. Conductive touch pads 13 are formed on the outer surface of dielectric panel 19. Conductive touch pads 13 may be formed by silk screening, photolithography, vapor deposition or other process depending upon the conductive material selected. In one embodiment, for example, conductive tin oxide touch pads are formed on the front surface of a glass panel by vapor deposition from stannous fluoride which is sprayed over the glass panel at 1250° F. Indicator touch pad markings 20 may then be silk screened or painted on the glass and/or tin oxide pads. The dielectric panel may be transparent or opaque; the use of a transparent material allows a display 12 and/or indicator lights, mounted behind panel 19, to be visible from the front surface thereof.

Figure 3:
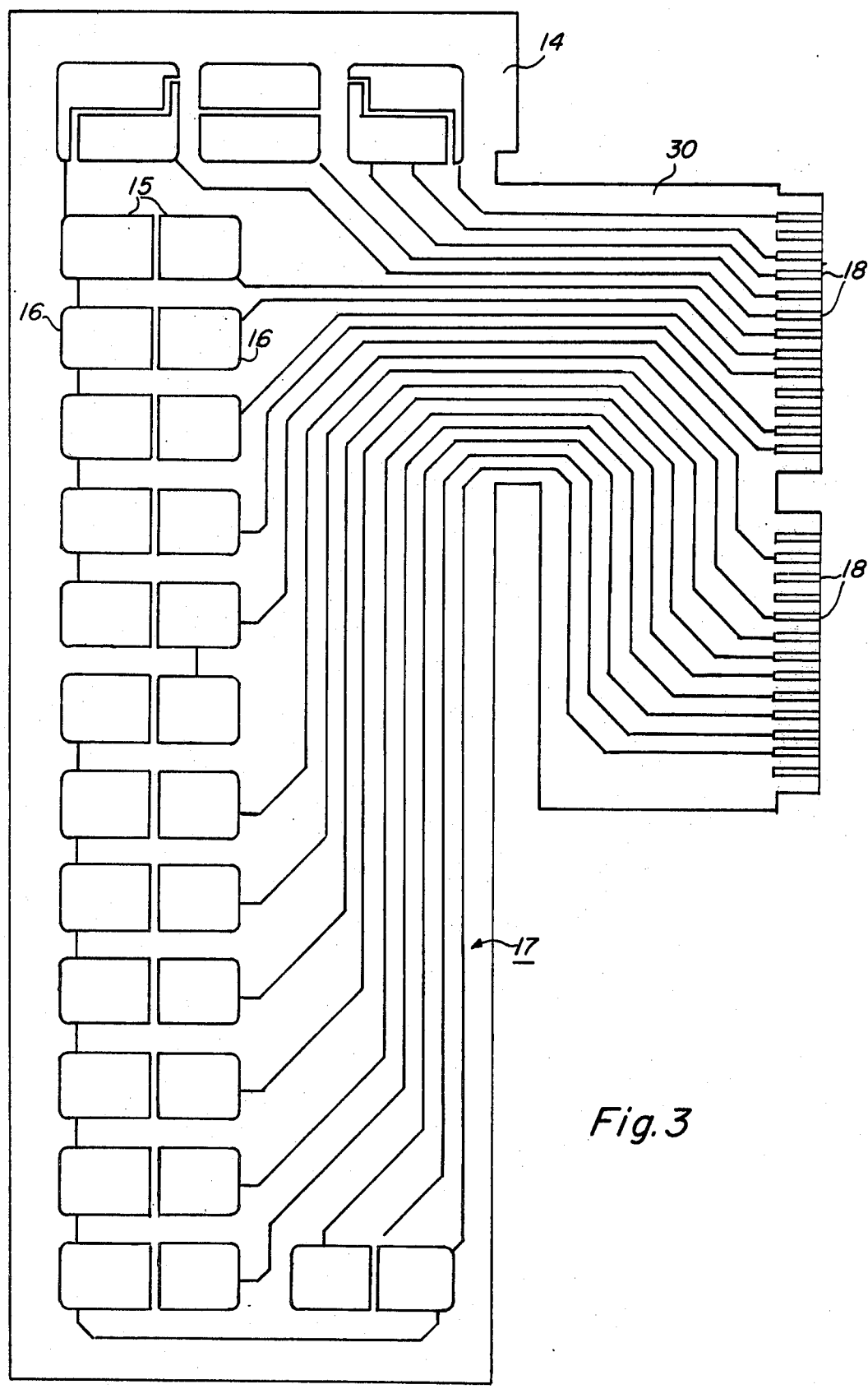
FIG. 3 is a back plan view of a patterned synthetic resin sheet which is bonded to the back surface of the dielectric panel of FIG. 2 in accordance with the present invention.

Referring to FIG. 3, pairs of spaced-apart conductive pads, i.e. 15, 16, etc., and conductive lead members 17, which includes conductive lead members to conductive pads 15, 16, etc., are formed on flexible synthetic resin sheet 14. This may be accomplished by vapor deposition of aluminum, silver, gold or other conductive material or by depositing silver epoxy or other conductive material by photolithographic or silk screening techniques or by painting on conductive paint. Also, less conductive materials than those listed above, such as resistive carbon paint, may be utilized to form leads having a desired resistance between conductive pads 15, 16, etc. and the circuit components to which they are to be connected. In one embodiment, for example, external resistors on the order of about 10,000 ohms, utilized to connect each capacitive touch switch to a semiconductor integrated input circuit, are eliminated by forming leads 17 from a resistive carbon material, each lead patterned to a particular length and width which provides a nominal resistance path of near 10,000 ohms.

Synthetic resin sheet 14 is die cut and then bonded to the rear major surface of dielectric panel 19 utilizing, for example, a suitable adhesive material. Synthetic sheet 14 is bonded to the dielectric panel so that each of the pairs of conductive pads 15, 16, etc., on synthetic sheet 14, are in registry with a corresponding touch pad 13 on the front surface of dielectric panel 19. Synthetic resin sheet 14 may be comprised of a polyester, polycarbonate, polyimide or other synthetic dielectric resin film suitable for carrying electrically conductive leads. In one example, a 2- to 20-mil thick, nominally 7-mil, polyester sheet, having silk-screened silver epoxy conductive pads and conductive leads formed thereon, is bonded by a 2- to 20-mil thick layer of 3M Company, 918 adhesive onto the rear surface of a ⅛″-thick soda lime glass panel.

It should be noted that the synthetic resin sheet provides shatter-proof protection to the glass panel as well as carrying the conductive pads and leads.

As illustrated in FIG. 3, synthetic resin sheet 14 includes a portion 30 having at least part of conductive lead pattern 17 formed thereon which portion is not bonded to dielectric panel 19; portion 30 serves as a flexible connector for connection of the touch panel to a circuit board or the like as will henceforth be described in detail.

Figure 4A:
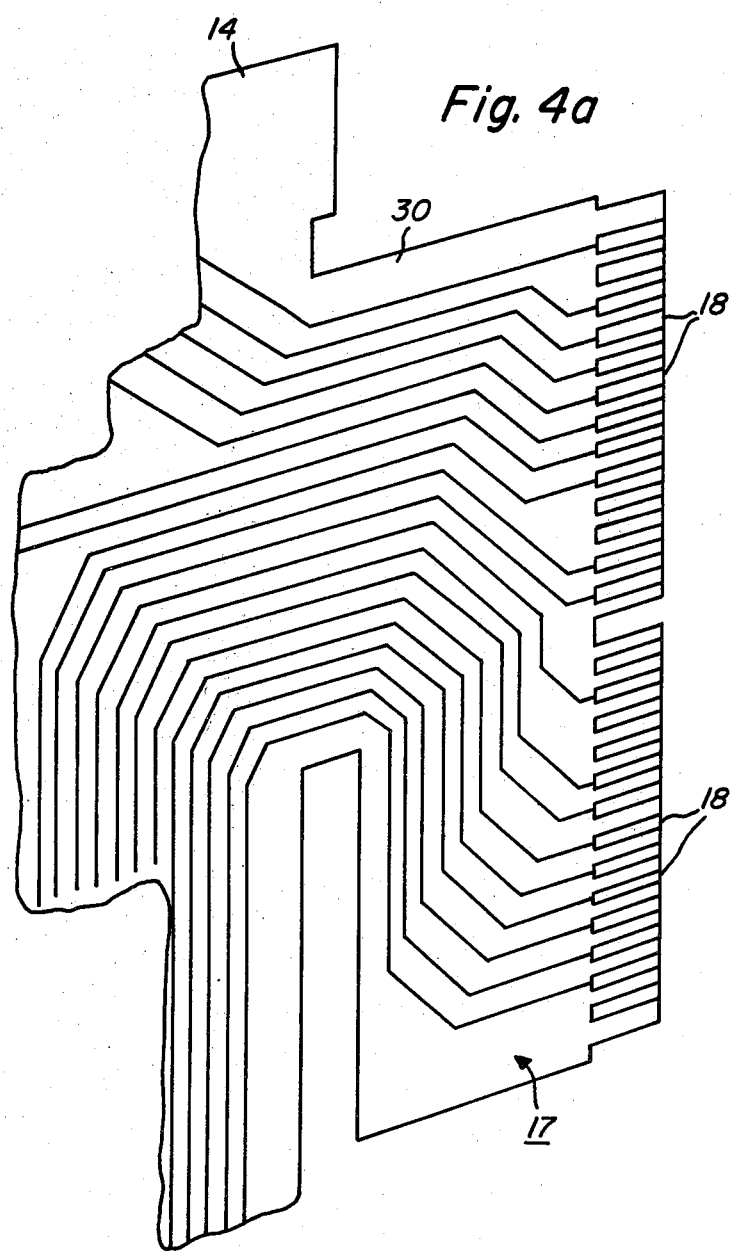

As previously mentioned, the conductive lead pattern on the synthetic resin sheet may be in a single layer formed on one surface thereof or multi-layers formed on opposite major surface thereof. Furthermore, multi-layer patterns may be formed either by stacking several of the flexible sheets or by folding a single sheet having a conductive lead pattern formed on one major surface thereof. This latter technique is illustrated, for example, in FIGS. 4a–4c where extension portion 30, providing the flexible connector means for connection of the touch panel to a circuit board, is folded as to provide, multi-layer patterns of conductors both terminating with terminal pads 18.

Figure 5:
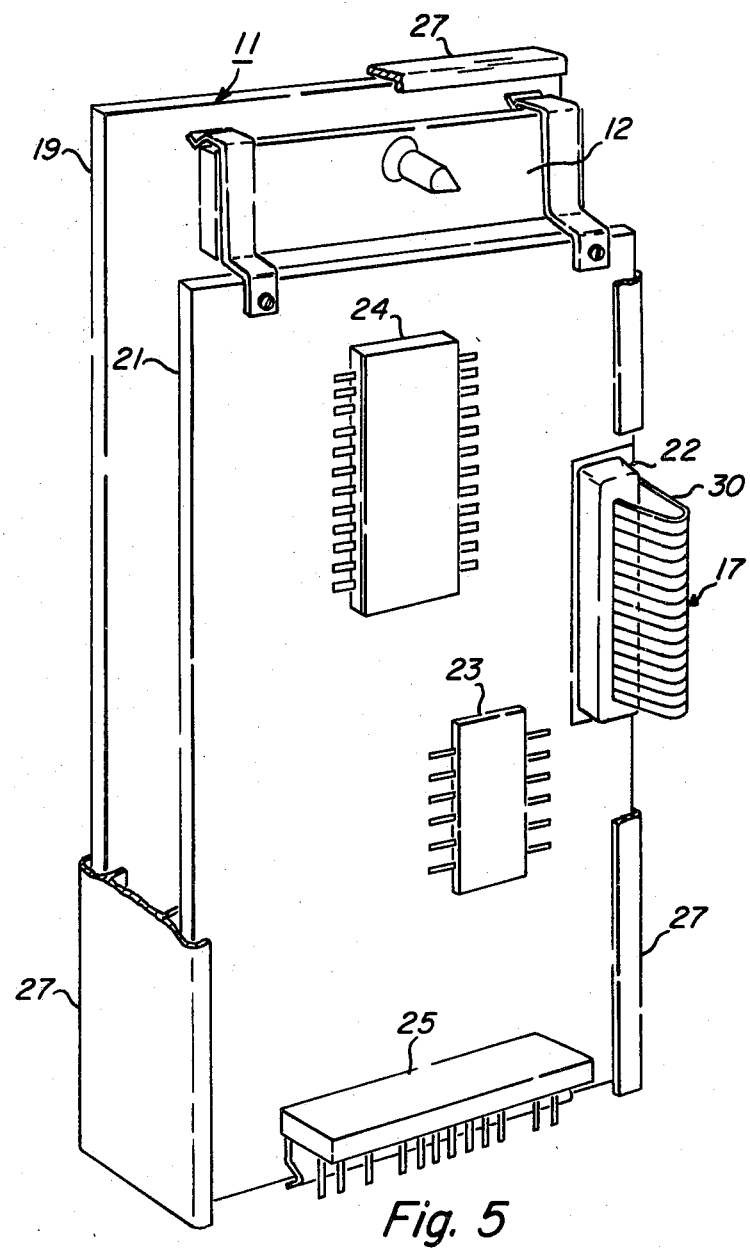
FIG. 5 is a back perspective view of the capacitive touch switch panel assembly of the appliance illustrated in FIG. 1.
Figure 6:
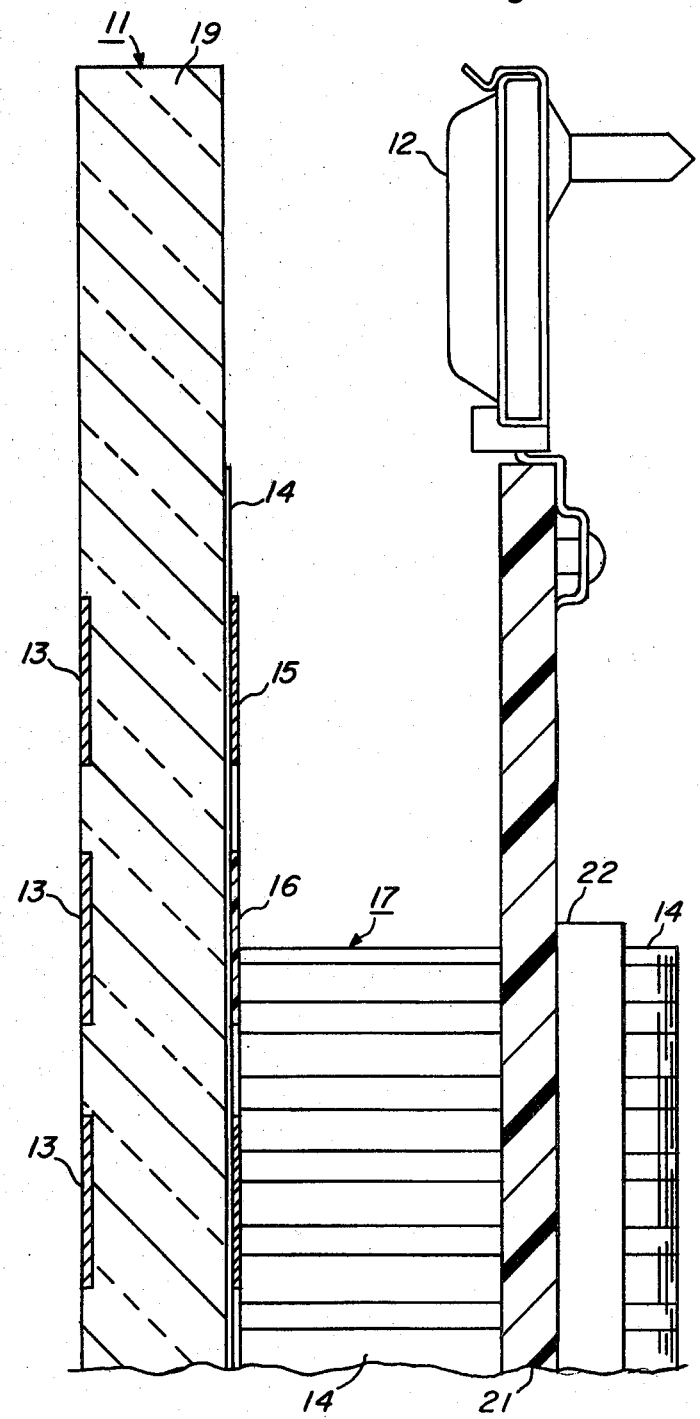
FIG. 6 is a cross-sectional side view of the assembly of FIG. 5.

Since extension portion 30 is flexible, the circuit board or other circuit component mounting means, to which the touch panel switches are electrically connected, may be mounted at any desired angle with respect to dielectric panel 19 (e.g. parallel, 90 degrees, etc.) or may be completely detached and remote. Referring to FIG. 5, circuit board 21 having an input circuit 23 and an integrated microprocessor circuit 24 mounted thereon along with a digital vacuum flourescent display device 12 is mounted by means of a suitable mounting frame 27 in parallel relation to the rear surface of the dielectric panel. Circuit board 21 includes a flexible film connection socket 22 in which extension portion 30 is inserted, socket 22 having conductive spring clip members which make electrical connection with terminal pads 18. Another connector means 25, mounted on circuit board 21 is utilized for connection of the circuit board to other components of the microwave oven 10;

i.e., a door latch switch, a power supply, a magnetron tube, etc.

Figure 7:
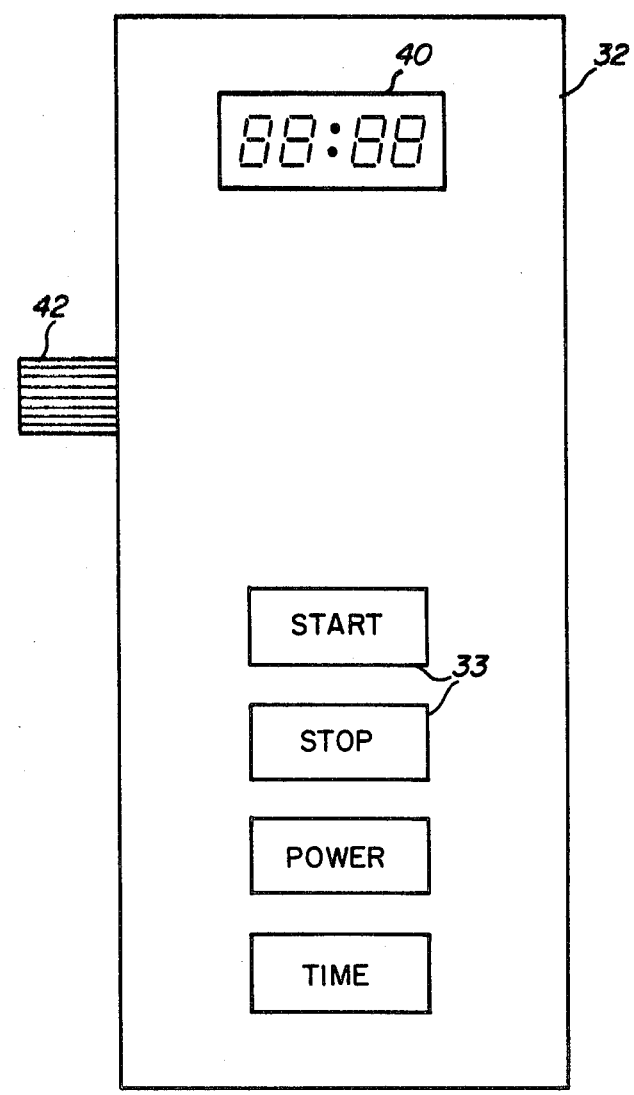
FIG. 7 is a front plan view of another embodiment of capacitive touch switch assembly in accordance with the present invention.
Figure 8:
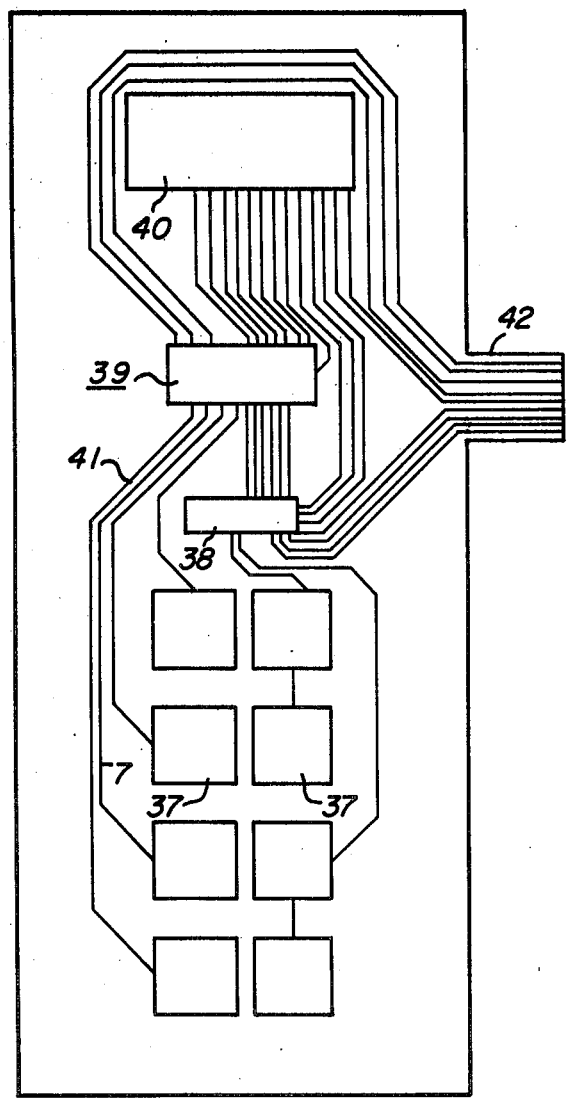
FIG. 8 is a rear planar view of a synthetic resin sheet utilized in the embodiment of FIG. 7 in which integrated circuits and display elements are mounted directly on the synthetic resin film and in which an interconnection pattern for the circuits and display elements are formed directly on the synthetic resin sheet.
Figure 9:
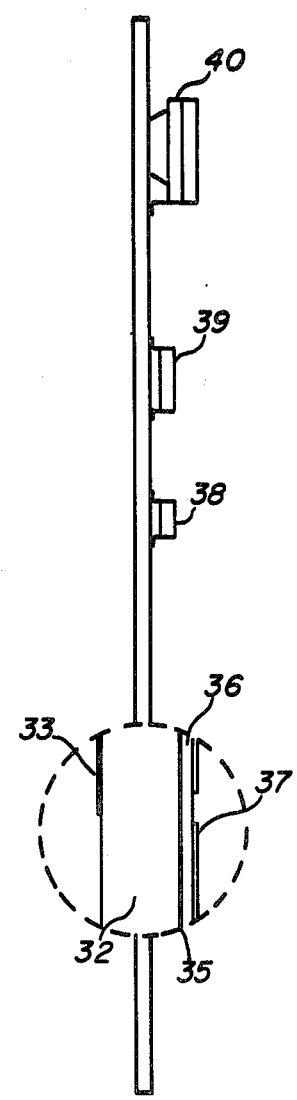
FIG. 9 is a cross-sectional side view of the capacitive touch switch panel assembly of FIG. 7.

Another embodiment of the invention is illustrated in FIGS. 7-9. In this embodiment, the circuit board is completely eliminated by mounting the semiconductor integrated electronic circuit and display elements directly on the flexible synthetic resin sheet thereby providing an extremely thin, versatile and inexpensive capacitive touch switch panel assembly. As shown in FIG. 7, rigid dielectric panel 32 has conductive touch pads 33 formed on the front surface thereof as previously discussed. Dielectric panel 32 is transparent to allow display 40, which is mounted at the rear of panel 32, to be visible from the front surface thereof.

As illustrated in FIG. 8, a flexible synthetic resin sheet 36 having an extension portion 42 includes pairs of conductive pads, i.e. 37, formed on a major surface thereof. Conductive lead members 41 are also formed on at least one major surface of sheet 36 to provide electrical connection paths between the conductive pads 37 and the semiconductor integrated input circuit 38, between integrated circuit 38 and a semiconductor integrated microprocessor circuit 39 and between integrated circuit 39 and a digital display means 40. Integrated circuits 38 and 39 and display means 40 are all mounted on flexible synthetic sheet 36 by means of solder or other connection means affixing the leads thereof to the conductive lead members 41. Conductive lead members 41 also extend along extension portion 42 to provide a flexible connector of desired length to connect the external circuitry for control by microprocessor circuit 39 which sends and receives control signals via the leads on extension portion 42.

Flexible sheet 36 is bonded to rigid dielectric panel 32 by means of an adhesive layer 35 with the pairs of conductive pads 37 in registered alignment with respective ones of the conductive touch pads 33 to provide a plurality of capacitive touch switches.

In alternate embodiments, integrated circuits 38 and 39 and/or display means 40 may be mounted on the rear surface of dielectric panel 32 and connected to conductive lead members 41.

Various embodiments of the present invention have now been described in detail. Since it is obvious that many changes and modifications can be made in the above-described details without departing from the nature and spirit of the invention, it is understood that the invention is not to be limited to said details except as set forth in the appended claims.

What is claimed is:

1. A method of fabricating a capacitive touch switch panel comprising the steps of:
(a) forming conductive touch pads on one major surface of a rigid dielectric panel;
(b) forming pairs of spaced-apart conductive pads and conductive leads extending to said conductive pads on one of two opposite major surfaces of a flexible synthetic resin sheet; and
(c) bonding the second of the said two opposite surfaces of said flexible synthetic resin sheet to the opposite major surface of said rigid dielectric panel with each of said pairs of conductive pads in registered alignment with a respective one of said conductive touch pads.

2. The method according to claim 1 wherein said flexible sheet is bonded to said dielectric panel by applying an adhesive between said panel and said sheet.

3. The method according to claim 1 including the step of cutting said flexible synthetic resin sheet essentially to the shape of said dielectric panel plus an extension portion, said extension portion having at least some of said conductive leads formed thereon for external connection of said capacitive touch switch panel.

4. The method according to claim 1 wherein said conductive touch pads are formed by vapor deposition of a conductive material.

5. The method according to claim 4 wherein said dielectric panel is comprised of glass and wherein tin oxide conductive touch pads are formed on said one major surface by forming a mask on said glass panel and spraying stannous fluoride over said glass panel and mask at about 1250° F.

6. The method according to claim 1 wherein said conductive touch pads are formed by painting a conductive material on said dielectric panel.

7. The method according to claim 1 wherein said conductive touch pads are formed on said dielectric panel by silk screening a conductive material on said dielectric panel.

8. The method according to claim 1 including the steps of mounting a circuit element on said flexible synthetic resin sheet and connecting said circuit element to said conductive lead members.

9. The method according to claim 8 wherein said circuit element is a semiconductor integrated circuit.

10. The method according to claim 8 wherein said circuit element is a display element.

11. The method according to claim 1 including the steps of mounting a circuit element on said opposite major surface of said dielectric panel and connecting said circuit element to said conductive lead members.

12. The method according to claim 11 wherein said circuit element is a semiconductor integrated circuit.

13. The method according to claim 11 wherein said circuit element is a display element.

14. The method according to claim 1 wherein said synthetic resin sheet is comprised of a polyester material.

15. The method according to claim 1 wherein said synthetic resin sheet is comprised of a polycarbonate material.

16. The method according to claim 1 wherein said synthetic resin sheet is comprised of a polyimide material.

17. The method according to claim 1 wherein said pairs of spaced-apart conductive pads are formed by silk screening a conductive material on said flexible sheet.

18. The method according to claim 17 wherein said conductive material is comprised of silver.

19. The method according to claim 1 wherein said pairs of conductive pads are formed by vapor depositing a conductive material on said sheet.

20. The method according to claim 19 wherein said material is comprised of silver.

21. The method according to claim 19 wherein said material is comprised of aluminum.

22. The method according to claim 1 wherein said pairs of spaced-apart conductive pads are formed by painting a conductive material on said sheet.

23. The method according to claim 22 wherein said material is comprised of silver.

24. The method according to claim 22 wherein the material is comprised of resistive carbon.

25. The method according to claim 1 including the step of folding a portion of said flexible sheet over another portion thereof to provide multi-layers of said conductive lead members with insulation provided by said flexible sheet therebetween.

26. A method of fabricating a capacitive touch switch panel assembly comprising the steps of:
(a) forming conductive touch pads on one major surface of a rigid dielectric panel;
(b) forming pairs of spaced-apart conductive pads and conductive leads extending to said conductive pads on a major surface of a flexible synthetic resin sheet;
(c) cutting said flexible sheet essentially to the shape of said dielectric panel leaving an extra flexible extension portion, said extension portion having at least some of said conductive leads formed thereon;
(d) bonding said flexible sheet to the opposite major surface of said rigid dielectric panel with each of said pairs of spaced-apart conductive pads in registration with a respective one of said conductive touch pads;
(e) mounting said rigid dielectric panel and a circuit board in fixed relation with respect to each other; and
(f) connecting the conductive leads formed on said flexible extension portion to respective conductors located on said printed circuit board.

27. The method according to claim 26 wherein said printed circuit board includes a socket member mounted thereon and said extension portion is plugged into said socket member to provide electrical connection therebetween.

28. The method according to claim 26 wherein said dielectric panel is comprised of glass and wherein tin oxide conductive touch pads are formed on said one major surface by: forming a mask on said glass panel, spraying stannous fluoride over said glass panel and mask at about 1250° F. and removing said mask.

29. The method according to claim 26 wherein said spaced-apart conductive pads are formed on said flexible sheet by silk screening a silver comprising material on said flexible sheet.

30. The method according to claim 26 wherein said synthetic resin sheet is comprised of a polyester material.

31. The method according to claim 26 wherein at least some of said conductive leads are formed of resistive carbon to provide a path of predetermined resistance to said at least some conductors.

32. The method according to claim 26 wherein said flexible sheet is bonded to said dielectric panel by applying an adhesive between said panel and said sheet.

* * * * *